United States Patent [19]

Bluzer

[11] 4,123,834
[45] Nov. 7, 1978

[54] OVERLAPPING ELECTRODE STRUCTURE FOR SOLID STATE DEVICES

[75] Inventor: Nathan Bluzer, Silver Spring, Md.

[73] Assignee: Westinghouse Electric Corp., Pittsburgh, Pa.

[21] Appl. No.: 806,401

[22] Filed: Jun. 14, 1977

[51] Int. Cl.² ............................................. B01J 17/00
[52] U.S. Cl. ..................................... 29/578; 29/580; 29/590; 29/591; 357/24
[58] Field of Search ................. 29/571, 578, 580, 591, 29/590; 357/24, 59

[56] References Cited

U.S. PATENT DOCUMENTS

| 3,793,090 | 2/1974 | Barile | 357/59 |
| 4,016,587 | 4/1977 | De La Moneda | 357/59 |

Primary Examiner—W. Tupman
Attorney, Agent, or Firm—W. E. Zitelli

[57] ABSTRACT

A method for making an overlapping electrode structure on an insulation layer comprising selectively etching a conducting layer on the insulation layer to form channels which are oxidized to form conducting ribbons surrounded by an insulating blanket. Contact windows are then opened in selected areas of the insulating blanket such that a conducting material cooperates with the conducting ribbons to form the overlapping electrode structure. In an alternative method, a bilayer structure comprising layers of first and second etching materials is formed on the insulating layer. Channels are then etched in selected portions of the bilayer structure and etch stops are formed along one side wall of the channel through the bilayer structure. The exposed surfaces of the insulation layer and first etching material are then simultaneously etched to form a sloped area in the surface of the insulation layer as a consequence of differential etching rates of the insulation layer and the first etching material. The remaining etch stops are then partially oxidized to form conducting ribbons which are electrically isolated by an insulating blanket. Contact windows are opened in selected areas of the insulating blanket. A conducting material is provided to the exposed surfaces of the insulation layer, the conducting ribbon and selected areas of exposed surfaces of the insulating blanket to provide the overlapping electrode structure on the insulation layer.

9 Claims, 14 Drawing Figures

OVERLAPPING ELECTRODE STRUCTURE FOR SOLID STATE DEVICES

CROSS REFERENCE TO RELATED APPLICATIONS

The subject matter of the present application is related to "A Sloped Insulator Charge Coupled Device", Ser. No. 806,402, filed June 14, 1977 by Nathan Bluzer et al; and "Methods For Making A Sloped Insulator For Solid State Devices", Ser. No. 806,400, filed June 14, 1977 by Nathan Bluzer now U.S. Pat. No. 4,098,638.

BACKGROUND OF THE INVENTION

1. Field of the Invention

The present invention relates to methods for making solid state devices and, more particularly, to methods for making an overlapping electrode structure on an insulation layer as used in solid state devices.

2. Description of the Prior Art

Recent developments in the art of solid state electronic devices have created a need for a method of making an overlapping electrode structure on an insulation layer such that the gap between adjacent electrodes on the insulation layer is limited to improve the performance of the solid state device. As a typical example, electrical gaps between adjacent electrodes as used in a charge couple device will cause the formation of surface potential barriers in the CCD semiconductor material that will inhibit the transfer of charge between adjacent potential wells of the CCD. By minimizing the gap between the adjacent electrodes, the potential barriers between the adjacent potential wells are limited, thereby improving the response and noise figure of the device. Other applications for the overlapping electrode structure will also occur to those skilled in the pertinent art.

In the prior art, methods have been developed for forming overlapping electrode structures that have been more or less effective in realizing the objective of limiting the effective electrical gap between adjacent electrodes. However, it was appreciated that methods that could diminish the effective electrical gap established by electrode structures made in accordance with methods known in the prior art could further improve the performance of the solid state devices in which they were used. Also, it was appreciated that more efficient methods of providing the overlapping electrode structure could improve the cost effectiveness of the solid state devices for which they were employed.

In this respect, it is further noted that recent developments in solid state electronic devices have created a need for making an overlapping electrode structure on a sloped insulator layer overlaying a semiconductor wafer. For example, a sloped oxide charge couple device has been investigated having improved transfer times between adjacent potential wells. The improved response times of the sloped oxide charge couple device are a consequence of the sloped disposition of the electrodes with respect to the interface of the semiconductor wafer and the insulation layer. This sloped disposition provides a lateral, or drift, field component in the electric field produced by the elements of the electrode array which drift field component operates as a mechanism for transferring charge carriers between adjacent wells of the charge couple device. The sloped attitude of the elements of the electrode array is achieved by supporting these elements on sloped portions of the insulation layer. Therefore, in the manufacture of the device, the controlled production of an electrode structure supported by sloped areas of the insulation layer is essential. Furthermore, it was recognized that if adjacent elements of the electrode structure were overlapping, the effective electrical gap between the adjacent elements would be reduced, thereby limiting the formation of surface potential barriers between adjacent wells of the charge couple device such as would inhibit charge transfer between the adjacent potential wells. Furthermore, it was appreciated that it would be desirable to employ a few processing steps as possible to produce the overlapping electrode structure on the insulation layer having selected areas of a controlled slope. Accordingly, there was a need in the prior art for an efficient method of forming an overlapping electrode structure on an insulation layer having selected areas of a predetermined slope.

SUMMARY OF THE INVENTION

In accordance with the present invention, an overlapping electrode structure is formed on an insulation layer by forming a layer of conducting material on the surface of the insulation layer and etching selected portions of the conducting material to form channels through the conducting material. The remaining portions of the conducting material are oxidized or covered by an insulator to form conducting ribbons that are electrically isolated by an insulating blanket which surrounds the conducting material. Contact windows are opened in selected areas of the insulating blankets that isolate the conducting ribbons and conducting material is provided over the exposed surfaces of the insulation layer and the conducting ribbons, and over selected areas of the exposed surface of the insulating blankets such that the conducting material cooperates with the conducting ribbons to form an overlapping electrode structure for which the effective electrical gap between adjacent electrodes is substantially equivalent to the thickness of the insulation blanket.

PREFERRED EMBODIMENT OF THE PRESENT INVENTION

Figure 1:
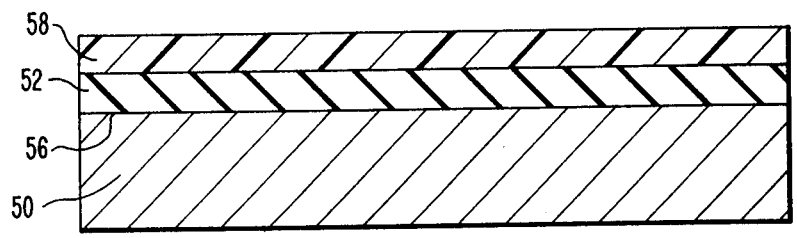
FIG. 1 shows the first step in the disclosed method for forming an overlapping electrode structure on an insulation layer in which an insulation layer of silicon dioxide is thermally grown on a semiconductor wafer and a layer of conducting material of polysilicon is deposited on the silicon dioxide layer.

In accordance with the present invention, an improved method for forming an overlapping electrode structure on an insulation layer that is useful in solid state devices is described in relation to FIGS. 1 through 5. In FIG. 1, a semiconductor wafer 50 which, for the example of the preferred embodiment, is comprised of silicon (Si), is provided with an insulation layer 52 to form a semiconductor-insulation layer interface 56. For the present example, the insulation layer is comprised of silicon dioxide ($SiO_2$) which is thermally grown on the silicon wafer 50 by exposing the silicon to an oxygen atmosphere at approximately 1100° C for a time of about 1 hour. Typically, the silicon dioxide layer is four to ten thousand Angstroms (4-10 KÅ) thick. FIG. 1 also shows a layer of polysilicon 58 which has been deposited on the surface of the insulation layer 52 that is oppositely disposed from the semiconductor-interface 56. The polysilicon layer 58 has a typical thickness in the range of 2-6 KÅ.

Figure 2:
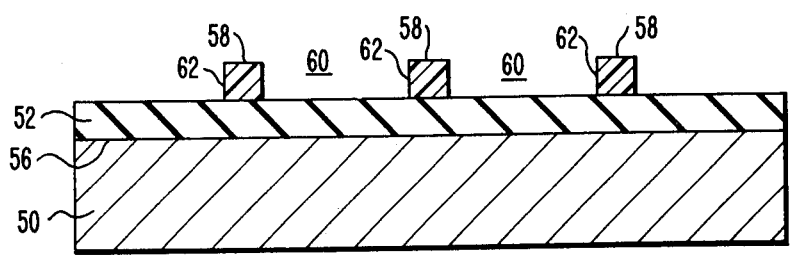
FIG. 2 illustrates the remaining structure after several channels have been etched through the polysilicon layer.

FIG. 2 shows that, by use of photolithographic techniques which are familiar to those skilled in the art, channels have been etched through selected portions of the polysilicon layer 58. Specifically, these channels 60 have side walls 62 formed by the edge surfaces of the remaining portions of the polysilicon layer 58, and have bottoms formed by the surface of the insulation layer 52 that is oppositely disposed from the semiconductor-insulation interface 56.

Figure 3:
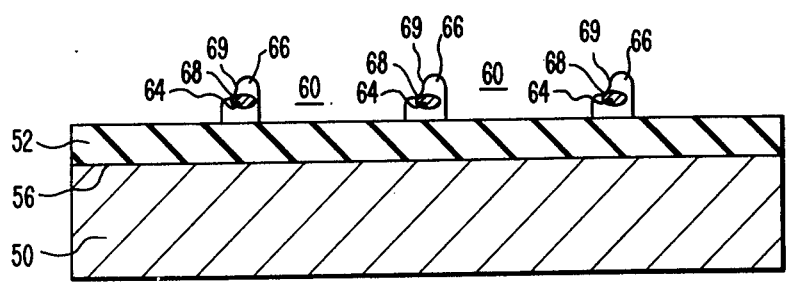
FIG. 3 shows the result of oxidizing the remaining portions of the polysilicon shown in FIG. 2.

FIG. 3 illustrates the next step in the presently disclosed method which is the oxidation of the remaining portions of the polysilicon layer 58 shown in FIG. 2. This partial oxidation of the remaining portions of the polysilicon layer 58 results in the substitution of conducting ribbons 64 which are electrically isolated by an insulating blanket 66 in place of each of the remaining portions of the polysilicon layer 58. The conducting ribbons 64 are comprised of the unoxidized portions of the polysilicon layer 58 while the insulating blanket 66 is comprised of the oxidized outer portion of the remaining portions of the polysilicon layer 58. As is shown in FIG. 3, the cross section of the conducting ribbon 64, which is insulated by the insulating blanket 66, shows that the conducting ribbon 64 has a continuous outer surface and has generally larger dimensions in a plane parallel to the semiconductor-insulation layer interface 56 than in a direction normal to the interface 56. The insulation blanket 66 has a typical thickness of approximately 2 KÅ.

As is also shown in FIG. 3, contact windows 68 have been opened in selected portions of the insulating blanket 66 to expose the underlying surface of the conducting ribbons 64. In the preferred embodiment, these contact windows 68 are opened by etching a selected portion of the insulation blanket 66 adjacent to one of the channels 60 to expose the underlying conducting ribbon 64. As shown in FIG. 3, the selected portion of the insulation blanket 66 that is etched is the shoulder portion 69 of the insulation blanket 66 adjacent to the channel 60. The shoulder portion 69 of the insulation blanket 66 corresponds to a corner portion of the remaining portions of the polysilicon layer 58 which were partially oxidized to form the insulation blanket 66 as was previously explained. Etching of the shoulder portion 69 of the insulation blanket 66 to expose the underlying surface of the conducting ribbon 64 can be accomplished by ion beam or photolithographic etching techniques familiar to those skilled in the art.

Figure 4:
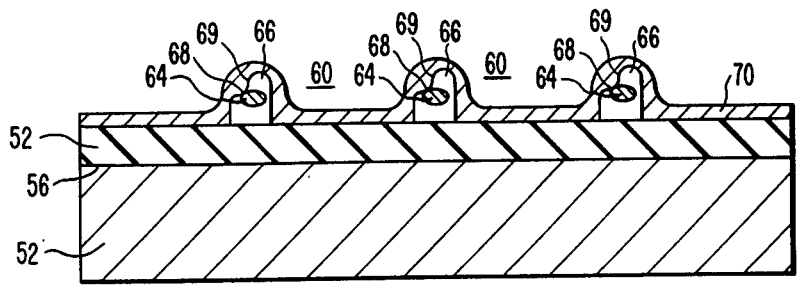
FIG. 4 shows the structure resulting when a layer of conducting material of aluminum has been evaporated onto the structure of FIG. 3.

FIG. 4 shows the addition of a layer of conducting material 70 to the exposed surfaces of the insulation layer 52, the insulating blanket 66, and the surface of the conducting ribbon 64 exposed through the contact window 68. Electrical contact is achieved, through the contact window 68, between the conducting ribbon 64 and the deposited conducting material 70. The conducting layer 70 is, in the particular example of the embodiment for FIGS. 1 through 5, comprised of aluminum (Al).

Figure 5:
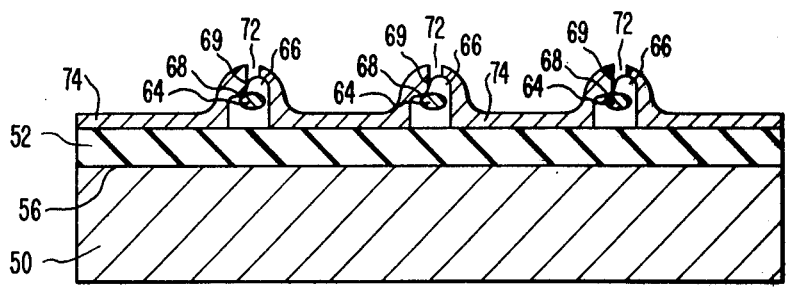
FIG. 5 shows the completion of the overlapping electrode structure by etching channels in selected portions of the aluminum layer of the structure shown in FIG. 4.

FIG. 5 shows the last step in the disclosed method for forming the overlapping electrode structure in which channels 72 are etched into the conducting layer 70 through well known photolithographic techniques to expose the top surfaces of the insulating blanket 66. Adjacent electrodes 74 located between the laterally adjacent insulating blankets 66 are thereby electrically isolated.

Although the adjacent electrodes 74 are isolated from each other by etching the channels 72 through the conducting layer 70 to expose the top surfaces of the insulating blankets 66 in accordance with well known photolithographic techniques, it will be appreciated that the effective electrical gap between the adjacent electrodes 74 is much less than obtained in accordance with electrode structures formed in accordance with techniques known in the prior art. Specifically, as is shown in FIG. 5, each of the electrodes 74 is in electrical contact with one of the conducting ribbons 64 by virtue of the contact of the electrodes 74 with the conducting ribbons 64 through the contact window 68 in the insulating layer 66. As shown in FIG. 5, although the typical photolithographic process opens channels 72 having considerably greater width, since the conducting ribbons 64 are electrically connected to the electrodes 74, the effective electrical gap between the adjacent electrodes is only that portion of the insulating blanket located opposite the contact windows 68 which separates the conducting ribbons 64 from the adjacent electrodes 74. As was previously mentioned, this portion of the insulating blanket 66 will be, typically, less than 2000 Å, so that the effective electrical gap between the adjacent electrodes will be on the order of 2KÅ. Furthermore, FIG. 5 illustrates that, since the channels 72 are provided in the conducting layer 70 to expose the top surfaces of the insulating blankets 66, the portion of the electrode 74 which is opposite the contact window 68, and, therefore is electrically isolated from the conducting ribbon 64, tends to overlap the conducting ribbon 64 as projected in the plane of the semiconductor-insulator interface 56. Therefore, the electric field provided by the overlapping portion of the adjacent electrode 74 tends to further reduce the effective electrical gap between the adjacent electrodes. Accordingly, the separation of the adjacent electrodes by the relatively thin portion of the insulating blanket 66 coupled with the electric field provided by the portion of the adjacent electrode 74 which overlaps the conducting ribbon 64 as projected on the plane of the semiconductor-insulator interface 56 cooperates to limit the formation of potential barriers that inhibit lateral charge transfer between potential wells formed by the electrodes 74 in the semiconductor 50. That is, the conducting ribbons 64 which are in electrical contact with one of the adjacent electrodes 74 and which are electrically insulated from the adjacent electrode which overlaps the conducting ribbon 64, provides a structure of overlapping electrodes in close proximity such that the electrical gap occurring between adjacent electrodes 74 is low.

Figure 6:
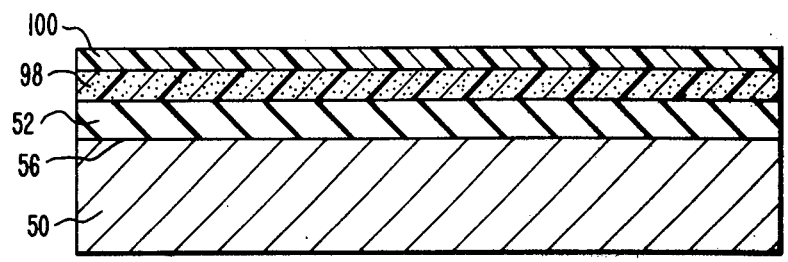
FIG. 6 illustrates the first step in a method for forming an overlapping electrode structure on an insulation layer having sloped areas in which an insulation layer of silicon dioxide is thermally grown on a semiconductor wafer, a first etching material of phosphorous doped glass is deposited on the silicon dioxide layer, and a second etching material of silicon nitride is deposited on the layer of phosphorous doped glass.

Also in accordance with the present invention, an improved method for forming an overlapping electrode structure on an insulation layer that is useful in solid state devices is described in relation to FIGS. 6 through 14. In the method for forming the overlapping electrode structure discussed in relation to FIGS. 6 through 14, the insulation layer has oppositely disposed surfaces wherein one of the surfaces includes first areas that are sloped with respect to the plane of the oppositely disposed surface. In FIG. 6, the semiconductor wafer 50 is provided with the insulation layer 52 to form a semiconductor-insulation layer interface substantially as was described in relation to FIG. 1. FIG. 6 shows the further addition of a first etching material to the insulation layer 52. The first etching material may, for example, be a phosphorous silicate glass layer 98 which is applied to the surface of the insulation layer 52 that is oppositely disposed from the semiconductor-insulation layer interface 56. The phosphorous glass layer 98 is applied by the process of gaseous deposition. Alternatively, phosphorous doped oxide could be substituted for the deposited phosphorous silicate glass layer. Typically, the phosphorous silicate glass layer 98 has a thickness in the range of 2-4 KÅ. Also in FIG. 6, a second etching material 100, also described as an etching shield, is applied to the surface of the phosphorous silicate glass layer 98 that is oppositely disposed from the interface of the silicate glass with the insulation layer 52. Typically, this second etching material 100 can be silicon nitride ($Si_3N_4$).

Figure 7:
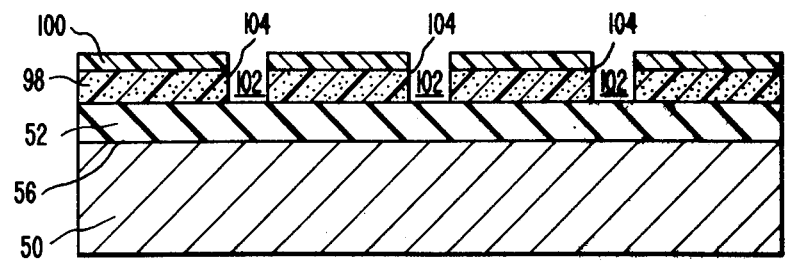
FIG. 7 shows the structure after channels have been etched through selected portions of the silicon nitride and phosphorous doped glass layers.

FIG. 7 illustrates the next step in the method in which channels 102 are etched in the second etching material layer 100 and the first etching material layer 98 in accordance with well known photolithographic techniques. As illustrative of one such technique, a layer of commercially available photoresist is spun over the surface of the silicon nitride layer 100 and windows are defined in the photoresist layer by covering the photoresist with an appropriate photolithographic mask and illuminating through the photolithographic mask. Typically, the lateral dimension of the windows defined in the photoresist will be approximately three microns ($3\mu$) and the distance between adjacent channels 102 will be on the order of 5-10 $\mu$). After the windows have been defined in the photoresist layer in accordance with the foregoing description, the structure is exposed to an etching solution to etch the portions of the silicon nitride layer 100 exposed through the windows of the photoresist layer such that these portions of the silicon nitride layer 100 are etched to the interface between the phosphorous silicate glass layer 98 and the silicon nitride layer 100. A typical etching solution for the silicon nitride layer 100 is hot phosphoric acid or plasma etch. The remaining structure is then exposed to a second etching solution which will etch exposed surfaces of the phosphorous silicate glass layer 98 down to the interface between the insulation layer 52 and the phosphorous silicate glass layer 98 to provide the structure shown in FIG. 7. A typical etching solution for etching the phosphorous silicate glass layer 98 to provide the channels 102 as shown in FIG. 7 is comprised of a solution of ten parts water ($H_2O$) to one part hydrogen fluoride (HF). The etch rate of phosphorous silicate glass in the water-hydrogen fluoride mixture is approximately 5-10 KÅ/min. If phosphorous doped oxide is substituted for the phosphorous silicate glass in the first etching material, the phosphorous doped oxide would have a similar etching rate. As illustrated in FIG. 7, the etching process of the phosphorous silicate glass 98 is continued until the portions of the phosphorous silicate glass layer exposed through the silicon nitride layer 100 are etched away to expose the underlying areas of the silicon dioxide layer 52, thus forming an array of channels 102 in the phosphorous silicate glass layer 98. FIG. 7 shows that, as a consequence of etching the channels 102 into the phosphorous silicate glass layer 98, the remaining portions of the phosphorous silicate glass layer 98 can be described as having an interface with the silicon nitride layer 100 and an interface with the insulation layer 52 and as also having edge surfaces extending between these two interfaces, said edge surfaces comprising one side wall 104 of the channel 102.

Figure 8:
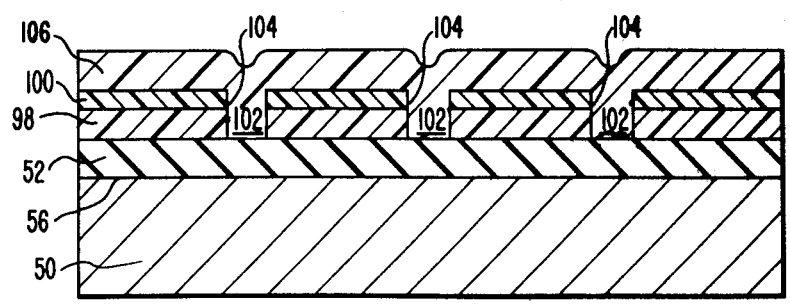
FIG. 8 illustrates the addition of a conducting material layer of polysilicon to the structure of FIG. 7.
Figure 9:
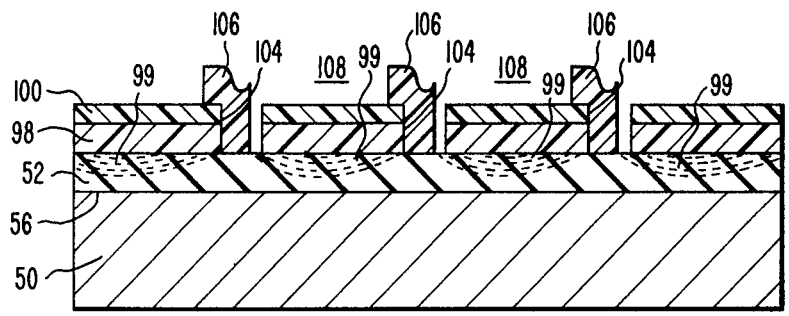
FIG. 9 shows the resulting structure after selected portions of the polysilicon layer shown in FIG. 8 have been etched away.

As described in relation to FIGS. 8 and 9, an etch stop is then formed over one edge surface 104 of the phosphorous silicate glass layer 98 and a portion of the surface of the insulation layer 52 exposed in the channel 102, and over the surface of the remaining portions of the silicon nitride layer 100 oppositely disposed from the interface between the phosphorous silicate glass layer 98 and the silicon nitride layer 100. As shown in FIG. 8, a conducting layer 106 of polysilicon is deposited on the exposed surfaces of the silicon nitride layer 100, the phosphorous silicate glass layer 98 and the insulation layer 52. As further shown in FIG. 9, channels 108 are etched in selected portions of the polysilicon layer 106 to expose areas of the insulation layer 52 which include a portion of the areas of the insulation layer 52 that were exposed in the channel 102 formed in the first etching material 98 and the second etching material 100. As also shown in FIG. 9, the remaining portions of the polysilicon layer 106 cover a portion of the upper surface of the silicon nitride layer 100 and also the edge surface of the phosphorous silicate glass layer 98 which was exposed along one side wall 104 of the channel 102 etched in the phosphorous silicate glass layer 98 and the silicon nitride layer 100. The remaining portions of the polysilicon layer 106 cooperate with the remaining portions of the silicon nitride layer 100 to comprise etch stops which protect one edge surface of the phosphorous silicate glass layer 98 along a side wall 104 in the previously etched channel 102 from attack by an etching solution during the next step of the disclosed process. The two side edge surfaces (not shown) which are adjacent to the side wall 104 of the silicate glass 98 can also be protected by the polysilicon 106.

In the next step of the process, the structure of FIG. 9 is exposed to an etching solution which will attack both the phosphorous silicate layer 98 and the insulation layer 52. In the present example, the etching solution of a mixture of ten parts of water to one part hydrogen fluoride is again used. The etch rate of thermally grown silicon dioxide in this etching solution is approximately 650 A/min. Comparison of the etching rate of the thermally grown silicon dioxide of the insulation layer 52 with the etching rate of the phosphorous glass shows that the etching rate of the phosphorous glass is approximately 10 times the etching rate of the thermally grown silicon dioxide. Due to the differential in these etching rates when the respective layers are exposed to the same etch, the progress of the etching through the phosphorous glass layer 98 in a direction lateral to the semiconductor-insulation interface 56 will proceed much faster than the etching of the insulation layer 52 in a direction normal to the semiconductor-insulation interface 56. Accordingly, the etching will occur in a lateral direction along the semiconductor-insulation interface 56 with etching of the insulation layer 52 in a direction normal to the interface 56 resulting in sloped areas being etched into the surface of the insulation layer, the lateral extent of said sloped areas being substantially equal to the lateral extent of the interface between the remaining portions of the phosphorous glass layer 98 and the insulation layer 52. As is now apparent, the sloped areas result as a consequence of the lateral etching time gradient along the insulation-phosphorous glass interface which stems from the differential etching rate of the insulation and phosphorous glass layers in a given etching solution. That is, since the etch stop formed by the silicon nitride layer 100 and the polysilicon layer 106 prevents etching along the insulator-phosphorous glass interface in one direction, the time for which a point on the surface of the insulation layer is exposed to the etching solution is a monotonically decreasing function of the location of the surface point along the insulator-phosphorous glass interface with respect to the etch-stop. This controlled deviation in the etching time for various points on the surface of the insulation layer 52 results in the etching of the sloped areas 110. The etching that occurs is illustrated by the dashed lines 99 of FIG. 9.

Figure 10:
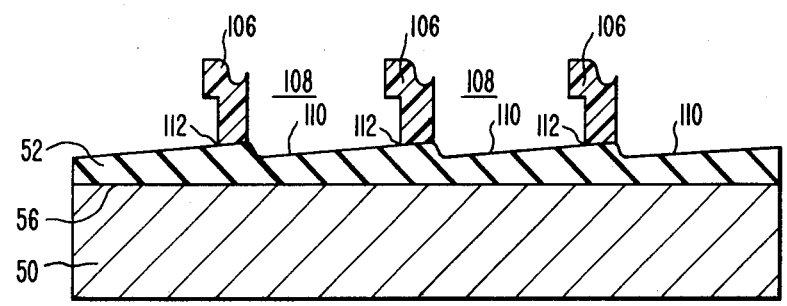
FIG. 10 shows the remaining structure after the structure of FIG. 9 has been exposed to an etching solution to provide sloped areas in the surface of the insulation layer.

After the remaining portions of the phosphorous glass layer 98 have been etched completely away, the structure will appear substantially as shown in FIG. 10 with the surface of the insulation layer 52 having first areas 110 which are sloped with respect to the semiconductor-insulator interface 56 and second areas 112 alternately disposed between said first areas. Typically, the distance between the semiconductor-insulator interface 56 and the surface of the insulation layer 52 for opposite ends of the sloped areas 110 will vary in the range of 1-10 KÅ in a direction normal to the interface 56. Exemplary distances of the distance of the sloped areas 110 from the interface 56 are 0.4 micrometers for the furthest point and 0.1 micrometers for the closest point where the sloped area 110 extends for approximately eight micrometers along the interface 56.

FIG. 10 also shows that portions of the polysilicon layer 106 which comprise the etch stops of the structure of FIG. 9, remain after the etching process is completed. These remaining portions of the polysilicon layer 106 are used in the further development of the electrodes for the solid state device as is explained in relation of FIGS. 11 through 14.

Figure 11:
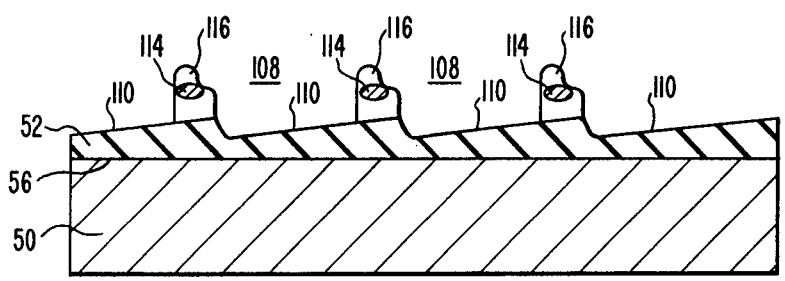
FIG. 11 shows the structure resulting from the oxidation of the polysilicon etch stops of FIGS. 9 and 10.

Similarly to the manner previously described with respect to FIGS. 2 through 5, an overlapping electrode structure is provided on the sloped insulation structure shown in FIG. 10 in accordance with the steps described with respect to FIGS. 11 through 14. FIG. 11 illustrates the next step in the presently disclosed method which is the oxidation of the remaining portions of the polysilicon layer 106 that comprise the etch stops as shown in FIG. 10. This partial oxidation of the remaining portions of the polysilicon layer 106 results in the substitution of conducting ribbons 114 which are electrically isolated by an insulating blanket 116 in place of each of the remaining portions of the polysilicon layer 106. The conducting ribbons 114 are comprised of the unoxidized portions of the polysilicon layer 106 while the insulating blanket 116 is comprised of the oxidized outer portion of the remaining portions of the polysilicon layer 106. As is shown in FIG. 11, the cross section of the conducting ribbon 114 which is insulated by the insulating blanket 116 shows that the conducting ribbon 114 has a continuous surface and has generally larger dimensions in a plane parallel to the semiconductor-insulation layer interface 56 than in a direction normal to the interface 56. The insulation blanket 116 has a typical thickness of approximately 2KÅ.

Figure 12:
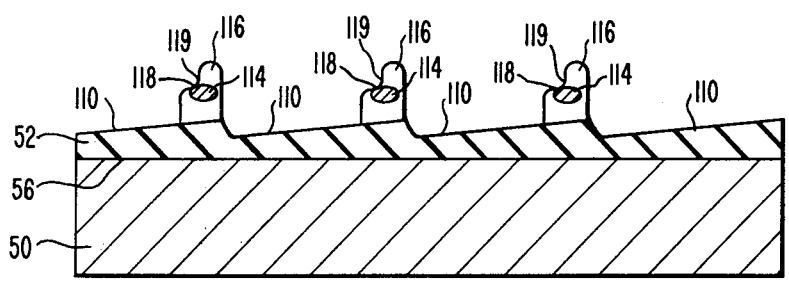
FIG. 12 shows the position of contact windows which have been etched into the oxidized portion of the etch stops shown in FIG. 11.

As is shown in FIG. 12, contact windows 118 have been opened in selected portions of the insulating blanket 116 to expose the underlying surface of the conducting ribbons 114. In the preferred embodiment, these contact windows 118 are opened by etching a selected portion of the inulation blanket 116 adjacent to one of the channels 108 to expose the underlying conducting ribbon 114. As shown in FIG. 12, the selected portion of the insulation blanket 116 that is etched is the shoulder portion 119 of the insulation blanket 116 adjacent to the channel 108. The shoulder portion 119 of the insulation blanket 116 corresponds to a corner portion of the remaining portions of the polysilicon layer 106 included in the etch stops which were partially oxidized to form the insulating blanket 116 as was previously explained. Etching of the shoulder portion 119 of the insulation blanket 116 to expose the underlying surface of the conducting ribbon 114 can be accomplished by ion beam or photolithographic etching techniques familiar to those skilled in the art.

Figure 13:
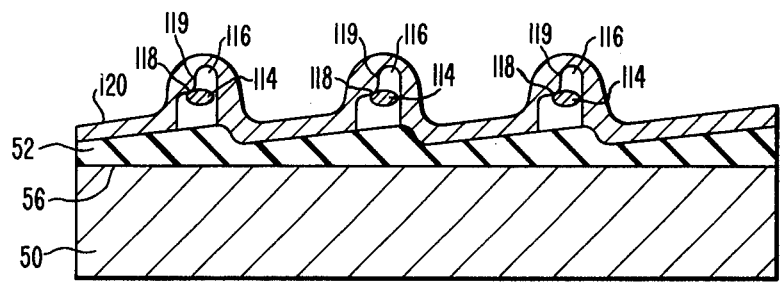
FIG. 13 illustrates the addition of a layer of conducting material to the structure of FIG. 12.

FIG. 13 shows the addition of a layer of conducting material 120 to the exposed surfaces of the insulation layer 52, the insulating blanket 116, and the surface of the conducting ribbon 114 exposed through the contact window 118. The conducting layer 120 is, in the particular example of the embodiment for FIGS. 6 through 14, comprised of aluminum (Al).

Figure 14:
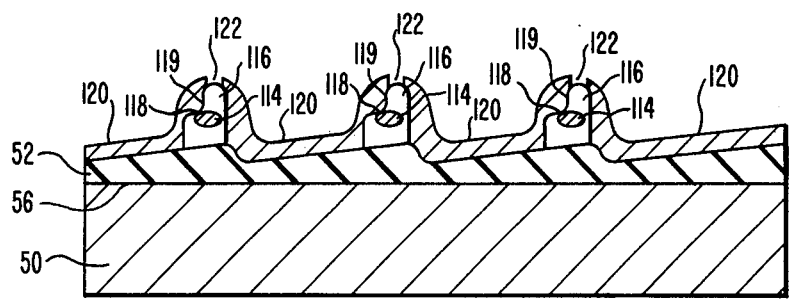
FIG. 14 shows the completion of the overlapping electrode structure by etching channels through selected portions of the layer of conducting material that was added in FIG. 13.

FIG. 14 shows the last step in the disclosed method for forming the overlapping electrode structure in which channels 122 are etched into the conducting layer 120 through well known photolithographic techniques to expose the top surfaces of the insulating blanket 116, thereby electrically isolating the adjacent electrodes 120 located between the laterally adjacent insulating blankets 116. Although the adjacent electrodes 120 are isolated from each other by etching the channels 122 through the conducting layer 120 to expose the top surfaces of the insulating blankets 116 in accordance with well known photolithographic techniques, it will be appreciated that for the reasons specified in relation to the description of FIG. 5, the effective electrical gap between the adjacent electrodes 120 is much less than obtained in accordance with electrode structures formed in accordance with techniques known in the prior art.

Although specific materials and dimensions have been suggested in the foregoing methods for forming an overlapping electrode structure for an insulation layer as described herein, the specific materials and dimensions set forth above are intended as illustrative as it is recognized that equivalent materials can be substituted and other dimensions may be more suitable for a particular application of the method. In the foregoing description, an improved method for forming an overlapping electrode structure for an insulation layer has been disclosed which affords an efficient and economical production of the described overlapping electrode structure.

I claim:

1. A method for providing an overlapping electrode structure to minimize the effective electrical gap between adjacent electrodes on an insulation layer of a charge coupled device, said method comprising:

forming a layer of conducting material on a surface of the insulation layer of the charge coupled device;

etching selected portions of the conducting material to form a plurality of channels in said conducting material which separate a plurality of unetched portins of conducting material on the surface of said insulating material, said etching including forming sidewalls adjacent each formed channel from the edge surfaces of the remaining unetched portions of said conducting material;

oxidizing the plurality of remaining unetched portions of the conducting material to form insulating blankets on their surfaces surrounding and electrically isolating conducting ribbons of unoxidized portions of the unetched conducting material;

opening a contact window in the insulating blankets of one of the sidewalls of each of said unetched portions of the conducting material to expose the unoxidized portion of the conducting material of said unetched portions;

providing conducting material over the exposed areas of the insulation material surface of each channel and over a portion of said sidewalls adjacent each channel to render an electrical contact of each conducting ribbon exposed through said contact window with the conducting material in the channel adjacent therewith to form adjacent electrodes across the surface of the insulation layer, the effective electrical gap between adjacent electrodes being substantially equivalent to the thickness of the insulation blanket that covers the conducting ribbons.

2. The method of claim 1 wherein said adjacent electrodes overlap common areas when projected onto the plane of the planar surface of the insulation layer.

3. The method of claim 2 wherein said step of providing conducting material over the exposed areas of the surface of said insulation material includes the steps of:

forming a layer of conducting material over the exposed surfaces of said insulation material, said conducting ribbons, and said insulating blankets; and etching channels in said layer of conducting material to expose selected surfaces of the insulating blankets.

4. A method for providing an insulation layer with an overlapping electrode structure, said method comprising:

adding a layer of etching material to one surface of the insulation layer that is oppositely disposed from a planar surface of the insulation layer, said etching material having a substantially higher etching rate than said insulation layer in a given etching solution;

adding an etch shield to the layer of etching material;

etching channels in selected portions of said etch shield and said layer of etching material;

providing etch stops comprised of a conducting material, said etch stops being located along one side wall of the channel etched in said etch shield and said etching material;

etching said etching material and said insulation layer to provide sloped areas on the insulation layer surface that is oppositely disposed from the planar surface of the insulation layer;

oxidizing said etch stop to provide an insulating blanket which surrounds and electrically isolates a conducting ribbon of unoxidized conducting material of each etch stop;

opening contact windows in the insulating blankets that isolate the conducting ribbons;

providing electrically isolated electrodes over the sloped areas of the insulation material surface and over the surface of said conducting ribbons exposed through said contact windows such that the effective electrical gap between adjacent electrodes is substantially equivalent to the thickness of the insulation blanket that covers the conducting ribbons.

5. The method of claim 4 wherein said insulation layer is formed on a semiconductor material prior to the step of adding the layer of etching material to insulation layer such that the planar surface of the insulation layer forms a semiconductor-insulation interface with the semiconductor material whereby the effective electrical gap between adjacent electrodes on the insulation layer limits the formation of surface potential barriers that inhibit charge transfer in the semiconductor material.

6. A method for forming an overlapping electrode structure on an insulation layer, said method comprising:

forming an insulation layer on a semiconductor material such that the insulation layer forms a semiconductor-insulator interface with the semiconductor material;

adding a layer of a first etching material to the insulation layer surface that is oppositely disposed frm the semiconductor-insulation interface;

adding a layer of a second etching material on the first etching material;

etching a channel through selected portions of said first and second etching materials;

forming an etch stop along one side wall of each of said channels in said first and second etching materials;

etching said etching materials and said insulation layer to form sloped areas in the surface of said insulation layer between said etch stops;

oxidizing said etch stops such that the outer portions of the etch stops form an insulating material and the inner portions of said etch comprise a conducting ribbon, the insulating material of said etch stops cooperating with said insulation layer to electrically isolate the conducting ribbons;

opening contact windows in the insulation material covering the conducting ribbons; and providing conducting material over the sloped areas of the surface of said insulation material and over the surface of said conducting ribbons exposed through said contact windows such that the conducting material cooperates with the conducting ribbons to form an electrode structure in which adjacent electrodes overlap and in which the electrodes are sloped with respect to the interface of the semiconductor and the insulation layer to provide an electric field having a substantial drift field component in said semiconductor.

7. The method of claim 6 wherein said step of providing conducting material over the sloped areas of the surface of said insulation material includes the steps of:

forming a layer of conducting material over the exposed surfaces of said sloped areas, said conducting ribbons, and said insulating blankets; and etching channels in said layer of conducting material to expose selected surfaces of the insulating blankets.

8. The method of claim 7 wherein the step of forming an etch stop along one side wall of each of said channels includes the steps of:

adding a layer of conducting material to the layer of the second etching material and to the channel etched through selected portions of said first and second etching materials; and etching channels in said layer of conducting material to form etch stops within the channels etched in said first and second etching materials.

9. A method for making an overlapping electrode structure in a solid state device, said method comprising:

forming an insulation layer on a semiconductor material such that the insulation layer forms an interface with the semiconductor material;

adding a layer of etching material to the insulation layer surface that is oppositely disposed from the interface of the insulation layer with the semiconductor material, said etching material having an etch rate that is substantially faster than the etch rate of said insulation layer for a given concentraton of etchant;

depositing an etch shield over the surface of said etching material, said etch shield having a substantially slower etch rate than said etching material for a given concentration of etchant;

etching channels through selected portions of said etch shield with a first etchant;

etching channels through selected portions of said etching material with a second etchant, the location of the channels in said second material corresponding with the location of the channels in said etch shield;

depositing a layer of conducting material over the surface of the remaining portions of said etch shield and within the channels etched in said etching material;

etching channels in said layer of conducting material to form etch stops along one wall of each of the channels etched in said etching material;

etching said insulation layer and the remaining portions of said etching material; the differential etching rates between said insulation layer and said etching material providing sloped areas in the insulation layer surface that is oppositely disposed from the interface of said semiconductor and said insulation layer, said sloped areas being located between said etch stops;

oxidizing the etch stops such that the outer portions of the etch stops form an insulation blanket around the inner portion of the etch stop, said inner portion forming an electrically isolated conducting ribbon;

opening contact windows through the insulation blanket to expose portions of said conducting ribbons;

evaporating a conducting material over the exposed portions of said insulation layer, insulating blanket, and conducting ribbons; and etching portions of said conducting material evaporated onto said insulating blanket to electrically insolate portions of said conducting material evaporated onto adjacent sloped areas of the insulation layer surface, each portion of said conducting material covering a sloped area of the insulation layer surface being electrically coupled to one conducting ribbon through said contact windows to form an electrode for the charge coupled device, said insulation blanket isolating adjacent electrodes of the charge coupled device to provide a device in which adjacent, electrically isolated electrodes overlap to limit the formation of surface potential barriers that inhibit charge transfer in the semiconductor material.

* * * * *